United States Patent
Pieterse et al.

(10) Patent No.: US 6,369,723 B1
(45) Date of Patent: Apr. 9, 2002

(54) REPLACEMENT OF SPECIAL CHARACTERS IN A DATA STREAM

(75) Inventors: Rob Pieterse, Aerdenhout; Leonard Antonius Roos Van Raadshooven, Zoetermeer, both of (NL)

(73) Assignee: Koninklijke KPN N.V. (NL)

( * ) Notice: Subject to any disclaimer, the term of this patent is extended or adjusted under 35 U.S.C. 154(b) by 0 days.

(21) Appl. No.: 09/701,935
(22) PCT Filed: Jul. 8, 1999
(86) PCT No.: PCT/EP99/04927
§ 371 Date: Dec. 6, 2000
§ 102(e) Date: Dec. 6, 2000
(87) PCT Pub. No.: WO00/07338
PCT Pub. Date: Feb. 10, 2000

(30) Foreign Application Priority Data
Jul. 29, 1998 (NL) .............................. 1009763

(51) Int. Cl.[7] ................................. H03M 5/00
(52) U.S. Cl. ........................ 341/55; 712/210
(58) Field of Search .................. 712/204, 210, 712/226, 227, 300, 213, 238; 341/55

(56) References Cited

U.S. PATENT DOCUMENTS 5,678,043 A * 10/1997 Ng et al. .................. 395/612
5,818,447 A * 10/1998 Wolf et al. ................ 345/335

* cited by examiner

Primary Examiner—Peguy JeanPierre
Assistant Examiner—Joseph Lauture
(74) Attorney, Agent, or Firm—Michaelson & Wallace; Peter L. Michaelson, Esq.

(57) ABSTRACT

In rows (1) of data elements (11, 12), there may occur special data elements, such as control characters. By replacing each special data element (12) by a replacement data element (14), which contains a positional indication of a next special data element (12') and which does not correspond to a special data element (12), it is possible to reproducibly remove all special data-elements from the row (1) without the length of the row increasing essentially. only one single supplementary data element (13) is required for transmitting the positional indication of the first special data element.

20 Claims, 2 Drawing Sheets

REPLACEMENT OF SPECIAL CHARACTERS IN A DATA STREAM

Figure 1:
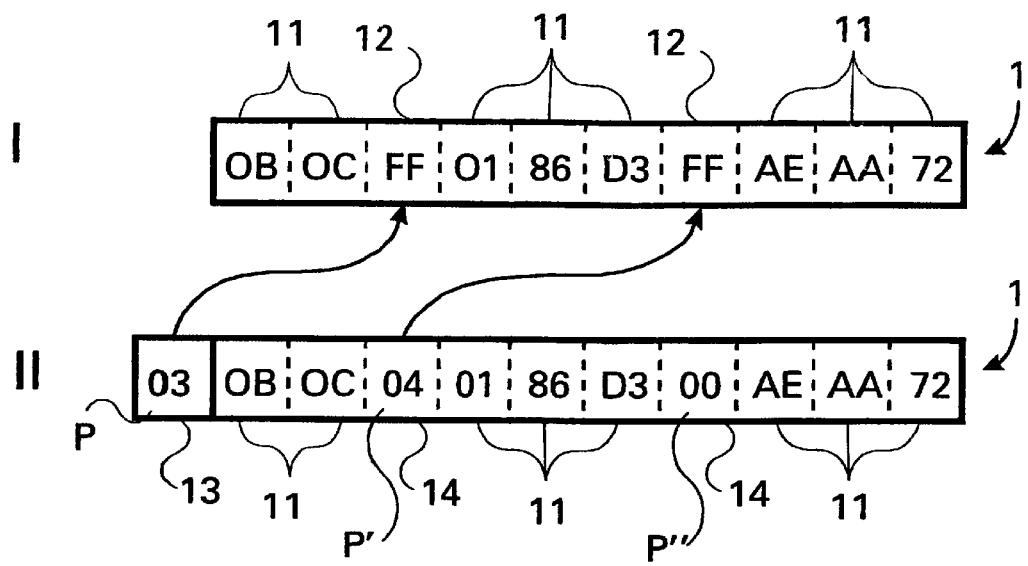

The invention relates to a method for transmitting a row of data elements, which row comprises normal data elements and control data elements, the method comprising:

detecting said control data elements within said row, and marking each control data element by supplementing a supplementary data element tot the row to be transmitted.

Such a method is known from practice.

When transmitting rows of data elements, the problem arises that to specific data elements there may be assigned, by some equipment, a specific control significance, or that for technical reasons a specific data element may not be included. Thus, the hexadecimal code "FF" (corresponding to the binary code "11111111", and therefore a byte having only ones) may be interpreted by equipment as a control character. If such a control data element is present among the data elements to be transmitted, it may cause problems in the transmission, since the data elements are not transparent for the equipment, i.e., may affect the operation of the equipment.

It is known to mark such control data elements at the transmitting end of the transmission route, e.g., by doubling them. In the above example, the data element "FF" would be doubled to "FFFF". In this connection, the equipment in the transmission route is constructed such that all double control data elements are not interpreted as a control character and the like. At the receiving end of the transmitting route, the double control data elements are unpacked to render single control data elements: "FFFF" is returned to "FF".

Said known method has the drawback that the number of data elements to be transmitted may increase essentially, since each control data element is doubled. In addition, it is necessary that all equipment present in the transmitting route is arranged for ignoring double control data elements and solely interpreting several control data elements. Since the control data elements in this known method are transmitted anyway, errors may easily occur here.

An object of the invention is to avoid the drawbacks of the prior art and to provide a method for transmitting data elements which enables excluding control data elements from the transmission in a reproduceable manner.

A further object of the invention is to provide a method for transmitting data elements which enables excluding control data elements from the transmission without essentially increasing the number of data elements to be transmitted.

For this purpose, a method of the type referred to in the preamble is, according to the present invention, characterised in that the supplementary data element comprises a positional indication to the first control data element in the sequence of data elements of the row, each control data element is replaced by a replacement data element which comprises a positional indication to next control data element, and a replacement data element does not correspond to a control data element.

By replacing each control data element by a replacement data element, which in itself is no control data element, all control data elements are removed from the row. By additionally, at the location of the removed control data elements, applying replacement data elements which contain a positional indication, it is possible at the receiving end to determine where control data elements have been removed from the row. Since basically there is required only one single supplementary data element for transmitting a positional indication of the first control data element occurring in the row, the row increases by one data element only, irrespective of the number of control data elements.

It is noted that from U.S. Pat. No. 5,363,098 discloses some analogies with the present invention, disclosing a method for compressing, decompressing and manipulating bit-maps. The bit-map is aligned along byte boundaries. Each aligned byte is classified as a gap byte (GBYTE) if all of the bits of the byte store the same logical value. Otherwise the byte is classified as a map byte (MBYTE). Adjacent bytes of the same class are grouped. Groups of gap bytes are encoded into an atomic sequence of bytes as a count of the number of bits included in the grouped gap bytes. Map bytes are duplicated in the atomic sequence and also associated with a count thereof. Said disclosure does not, as the present invention does, address the problem of (control) characters like the hex code "FF", which may control or affect the operation of computer equipment.

The method according to the invention is preferably carried out in such a manner that the positional indication to next control data element comprises a relative position with respect to a replacement data element. By applying a relative position, i.e., with respect to the preceding replacement data element, instead of an absolute position, i.e., with respect to the supplementary data element, the positional indication will generally have a smaller value, so that fewer bits may suffice.

If the positional indication to next control data element is not capable of being accommodated in a supplementary or replacement data element, the method according to the invention is advantageously carried out in such a manner that at least a further supplementary data element, which contains a further positional indication, is inserted into the row. The further positional indication may indicate the position of the next control data element, or the position of another further supplementary data element. In this manner, there may also be indicated the positions of control data elements far removed from one another, whose positional indications might exceed the number of bit positions available in a supplementary data element.

In this connection, the method is advantageously carried out in such a manner, that the at least one further supplementary data element in the row is inserted at the farthest position whose positional indication is capable of being accommodated in a supplementary or replacement data element. As a result, the position of a control data element is capable of being indicated by as few further supplementary data elements as possible.

It is also possible to carry out the method according to the invention in such a manner, that a supplementary or replacement data element, apart from a positional indication, also comprises a length indication which indicates the number of data elements taken by the positional indication. Using such a length indication, the number of bit positions available to the positional indication might be expanded in a simple manner.

The control data elements may all be of the same type. That is to say, in fact there is only one control data element, however, which may occur several times in a row.

It is also possible that the control data elements are of several types. In that case there are several, mutually different, control data elements which each may occur once or several times in a row. The method according to the invention is then advantageously carried out in such a manner that a replacement data element additionally comprises a type indication of a replacement control data element. The type indication is advantageously chosen in such a manner that correspondence with a control data element is excluded. In other words, the type indication has a (bit) pattern which, irrespective of the value of the positional indication, is not capable of providing any control data element.

In order to prevent that a positional indication, in combination with non-control data elements, might unintentionally form a control data element, the method according to the invention is advantageously carried out in such a manner, that a data element is marked as a control data element if the data element corresponds to part of a control data element. In this connection, the length of this part plus the length of the same data element preferably equals the length of a control data element.

For the sake of security, it is preferably assumed in advance that a positional indication is part of a control data element.

In order to prevent that at least part of the supplementary data element is capable of being replaced by a receiving data element, as a result of which the positional indication in question might be overwritten, the method according to the invention is preferably carried out in such a manner that, if the positional indication present in the supplementary data element has a smaller value than the length of the supplementary data element, the value is increased by an auxiliary value to said length, and that the replacement data element in question replaces the data element which begins at the position adjacent to the supplementary data element. In doing so, the length of the replacement data element is preferably reduced by the auxiliary value.

A data element may basically comprise a random, preferably predetermined, number of bits. The invention may also be applied to situations in which a data element comprises exactly eight bits (one byte).

A further object of the invention is to indicate devices and a system for implementing the method.

The invention will be explained in greater detail below by reference to the figures.

FIG. 1 schematically shows a row of bytes which is processed and transmitted in accordance with the invention.

Figure 2:
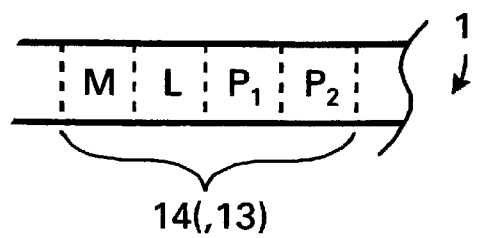

FIG. 2 schematically shows a possibly supplementary or replacement data element.

Figure 3:
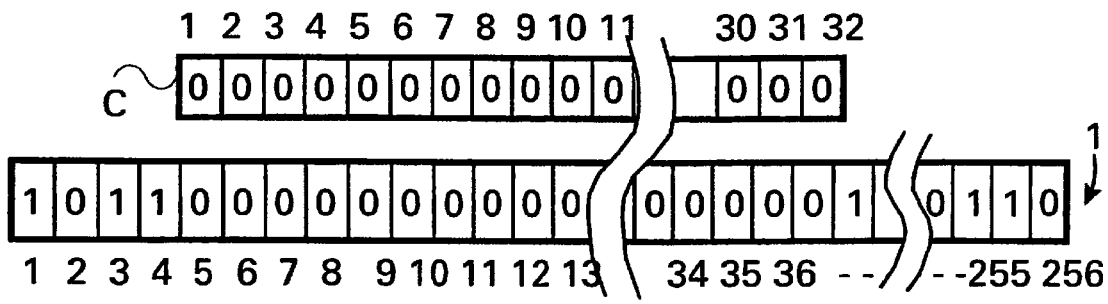

FIG. 3 schematically shows a row of bits transmitted in accordance with the invention.

Figure 4:
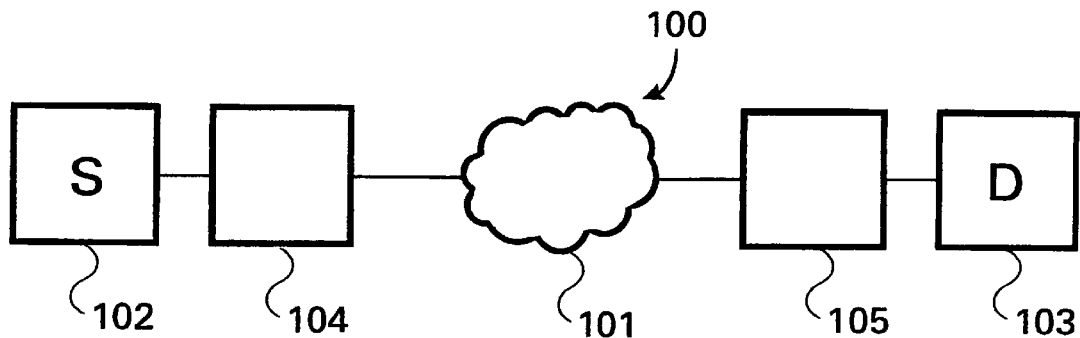

FIG. 4 schematically shows a system for transmitting rows in accordance with the invention.

Figure 5:
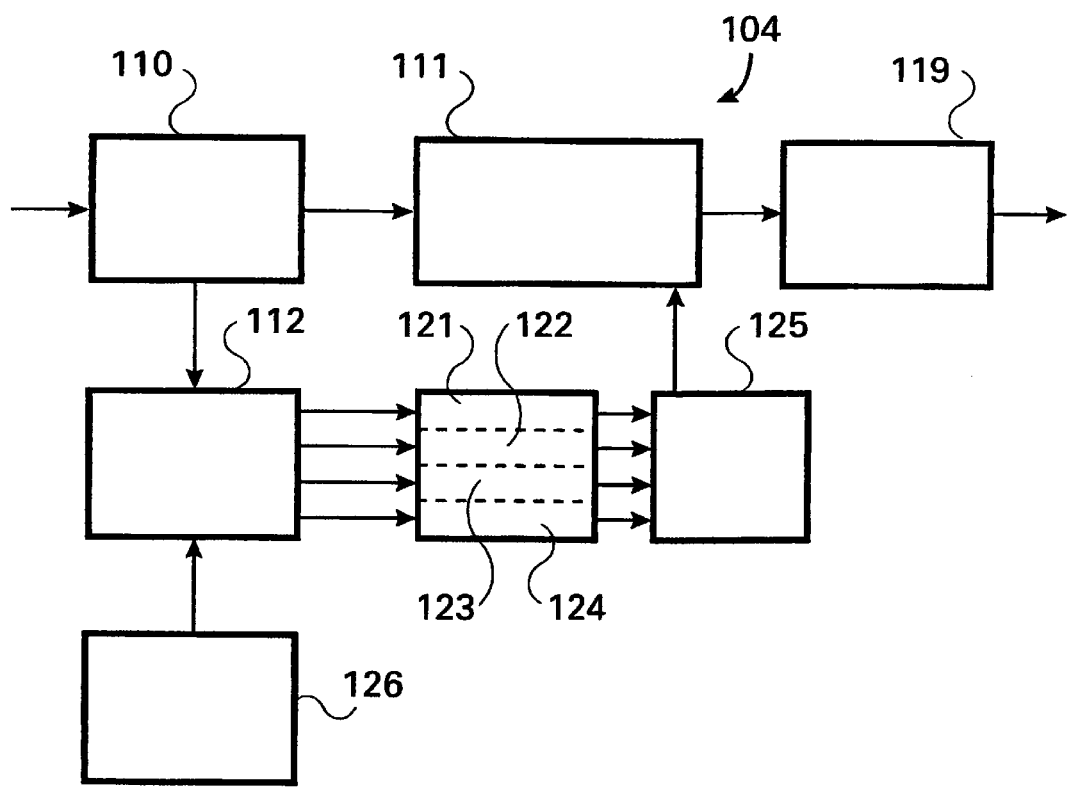

FIG. 5 schematically shows a device for transmitting rows in accordance with the invention.

The row 1, shown only by way of example in FIG. 1, comprises a number of data elements, each of which consists of one byte. The values of the data elements are indicated hexadecimally and may vary, in the example of FIG. 1, from 00 (=decimal 0) to FF (=decimal 255). The value FF, however, may be interpreted by certain devices as a control code (such as "End of message"), as a result of which a data element having this value will be denoted as a control data element 12. The remaining data elements of the row 1 are indicated as normal data elements 11.

Since transmitting the control data elements 12 may give rise to problems, in accordance with the invention these are excluded from the transmission in a reproduceable manner. At the transmitting end of a transmission route, said processing of the row is effected as follows:

a. To start with, the position of the first control data element is determined (in a manner known to those skilled in the art). In the example shown, the first control data element occupies the third position in the row.

b. Then there is added to the row, in the example shown at the beginning, a supplementary data element containing said positional indication, which marks the control data element.

c. Subsequently, the position of a possibly next control data element (12') is determined. Said position preferably is the relative position with respect to the preceding control data element since, for indicating a relative position, generally fewer bits are required.

d. In connection with this, the preceding control data element 12 is replaced by a replacement data element 14, which contains the positional indication of the next control data element 12. If there is no next control data element 12, the positional indication is made equal to zero.

e. Finally, the steps c. and d. are repeated until all control data elements have been replaced, and the row processed in this manner is transmitted or stored.

In this manner, all control data elements 12 are replaced by a replacement data element 14 which indicates the position of the next control data element. To the row, in this case there is added only one data element, namely, the supplementary data element 13. The positional indication may be formed by a number denoting the relative position of the next control data element. A positional indication is part of a supplementary or replacement data element, and may entirely coincide with it.

As may be seen from FIG. 1, the positional indications serve as pointers of a linked list, each element of the list always pointing to the position of the next element.

Using data elements of one byte, the positional indication may amount to at most 255. Since it is desirable that a replacement data element does not correspond to a control data element 12, in this example the value 255 (=FF hexadecimal) is excluded. It is of course possible that even the relative positional indication supplies a number in excess of 254. In this case, various solutions are possible.

To start with, in the event that the positional indication to next control data element (12') is not capable of being accommodated within a supplementary or replacement data element, at least there may be inserted a further supplementary data element 15 into the row 1. Here, the supplementary data element 14, which points to the position of the further supplementary data element 15, may have the hexadecimal value FE (=decimal 254). If necessary, there may be included several further supplementary data elements 15 in the row, the last one generally pointing to the position of a replacement data element 14.

Secondly, apart from a positional indication P a supplementary or replacement data element (13, 14) may comprise a length indication L, which indicates the number of data elements or bits occupied by the positional indication and/or, as mentioned before, a type indication (T) of the replacement control data element (12, 12'). This is schematically shown in FIG. 2. In this case, a positional indication may occupy, e.g., two or three bytes, as a result of which there may be indicated a relative position which is much larger than 254. In this manner, inserting into the row one or more further supplementary data elements 15 is avoided. In order to be capable of recognising the combination of a positional and a length indication as such, the length indication is preferably preceded by a marking M which, e.g., is equal to the value FD (=253 decimal). In this connection, said value must be excluded for the positional indication, as a result of which the positional indication in the example shown may have a value at most equal to FC (=252 decimal).

At the receiving end of the transmission route, the original row 1 may be reconstructed as follows:

a. The data element coming first in the row is interpreted as a supplementary data element 13, which indicates the position of the first replacement data element 14.

b. The data element in the position in question is interpreted as a replacement data element 14, which indicates the position to next replacement data element 14. The replacement data element 14 is replaced by a data element having the excluded value (FF).

c. Step b. is repeated until there is found a replacement data element 14 having a positional indication equalling zero.

This way, the original row may be reconstructed in a simple manner. In step b., it is possible to take into account, if necessary, further supplementary data elements which may be detected using the corresponding values (FE, FD).

As shown in FIG. 3, data elements may comprise any number of bits. In the example of FIG. 3, a row comprises 256 bits, and the following data elements should not be present:

32 zeros.

32 ones.

32 elements in a continuously alternating row starting with a zero (31 0/1 transitions).

32 elements in a continuously alternating row starting with a one (31 1/0 transitions).

These are the control data elements in this example, which must be replaced in the row of 256 bits.

Basically, marking and replacing the control data elements in this embodiment may take place in the same manner as with the embodiment of FIG. 1. While in the example of FIG. 1 there is applied a check window having a size of exactly one byte which is always moved by steps of one byte along the row, in the example of FIG. 3 there is used a 32-bit check window C which is moved in steps of one bit along the row. The check window C, in which the correspondence between the row 1 and a control data element is checked, at most has the length of a control data element. A replacement data element may be smaller than the check window. In this example, use is made of 32-bit replacement data elements which comprise a positional indication of, e.g., 8 bits. Several of the remaining bits may be used for an indication denoting which of the four control data elements has been replaced, and for a pattern-breaking coding, as will be explained later.

Whenever a control data element is detected, it is replaced by a replacement data element which indicates the position to next replacement data element. The values of the four control data elements are values excluded for the replacement data elements.

There may arise a problem if a supplementary data element, together with the subsequent bits of the row, provides a supplementary data element. Such may be the case, e.g., if the supplementary data element contains only a positional indication equal to zero, and the original row starts with zeros.

A first solution to this problem is choosing the length of the check window in such a manner that it is smaller than the difference between the length of the supplementary (or replacement) data element and the length of the control data element. In the example of FIG. 3, the length of the check window would then amount to at most 24 bits, since a control 32-bit data element (e.g., 32 zeros) would always be detected by a 24-bit check window, irrespective of the 8-bit value of the supplementary data element.

A second solution to this problem is initialising a procedure for looking up a control data element in such a manner, that the occurrence of possibly unfavourable values of the supplementary data element is taken into account. Looking for a control data element is preferably carried out by counters which, e.g., each count zeros, ones, 0/1 pairs and 1/0 pairs, respectively, and which are reset if another value occurs. In this example, the procedure may be initialised by giving all of these counters, at the beginning of the row, the initial value eight.

The above solutions may be applied individually or in combination.

An exceptional situation may occur if the positional indication of the supplementary data element points to itself, i.e., in the example shown has a value in the range of 1–8 (first eight bits of the row extended by the supplementary data element). In this case, the supplementary data element, and the positional indication with it, might be overwritten. This might be compensated by processing the positional indication of the supplementary data element in a control manner.

If the positional indication points to itself, i.e., in the example shown has a value of 1–8, the value is increased by such an auxiliary value that the positional indication amounts to eight and therefore does no longer point to itself. In order to compensate the shift of the replacement data element originated in this manner, the latter is shortened by a length corresponding to the auxiliary value.

Suppose, e.g., that the positional indication initially equals three, in other words, a control data element is considered to begin at the third bit of the supplementary data element (please note that it is preferably assumed that the supplementary data element has a bit pattern which contributes to the formation of a control data element; such bit pattern, however, need not be present). The auxiliary value then is (8−3)=5. The positional indication is made equal to 8, and the replacement data element should shortened over a length of 5 bits. This is preferably effected by omitting 5 bits from the bit positions 5–12 of the supplementary data element 5.

At the receiving end, it is checked in such an embodiment whether the positional indication of the supplementary data element points to itself, i.e., has a value less than 8 in the example shown. If such is the case, the replacement data element is assumed to begin at the eighth position of the (supplemented) row, the auxiliary value is determined from the value of the positional indication, and the length of the replacement data element is shortened by the auxiliary value. Reconstructing the original row is then carried out with due observance of the above.

A replacement data element, too, may form a control data element together with preceding or subsequent bits.

A solution to this is applying a pattern-breaking code in the supplementary and/or replacement data elements. By applying a code 1100 (binary) in each supplementary and/or replacement data element in the example shown, a possible pattern of ones only, zeros only, or an alternation of ones and zeros, is broken. If the row, e.g., contains the bits:

. . . 1 0000 0000 0000 0000 0000 0000 0000 0000 . . . , these are replaced by:

. . . 1 0011 0011 0011 0011 pppp pppp 0011 0011 . . . , with the bits "pppp pppp" constituting the positional indication of the next control data element. Irrespective of the value of the bits "pppp pppp", a control data element is excluded.

The pattern-breaking code preferably also is an indication of the control data element which has been replaced. In the example of FIG. 3, the following binary codes are applied:

32 zeros: 0011
32 ones: 1100
31 0/1 transitions: 0110
31 1/0 transitions: 1001.

At the receiving end, the original control data element may simply be substituted on the basis of the code.

The system 100 schematically shown in FIG. 4 for transmitting rows of data elements comprises a telecommunications network 101, an (e.g., digital) data source 102, a data destination 103, a first processing device 104, and a second processing device 105. In the first processing device 104, there are processed rows of data elements generated in the data source 102 in accordance with the invention. Processing comprises marking and preferably removing control data elements. The processed rows are transmitted, by way of the communications network 101, to the second processing device 105. In the second processing device 105, the rows are reconstructed in accordance with the invention, whereafter they are transmitted to the destination 103. It will be understood that the system 100 may comprise several first processing devices 104 and second processing devices 105. Although the processing devices 104 and 105 in this example are suitable for transmitting and/or receiving, it is also possible to apply separate transmitting/receiving devices.

A first processing device 104 comprises, e.g., an input buffer 110 for receiving rows of data elements. The device further comprises a processing unit 111 connected to the input buffer 110. In a register 126, there are stored bit patterns which are capable of forming control data elements. In a comparator 112, coupled to the input buffer 110 and the register 126, the contents of the input buffer 110 are compared with the bit patterns of the register 126. The results of the comparison are outputted to counters 121, 122, 123 and 124, which contain, e.g., zeros, ones, 1/0 transitions and 0/1 transitions, respectively. A comparator 125, connected to the counters 121–124, contains the length of a control data element. If a specific bit pattern has occurred a certain number of times, the comparator 125 outputs a signal to the processing unit 111. The latter then replaces the control data element in question by a replacement data element. Pattern-breaking codes, from which there may be constructed a replacement data element, inter alia, may be stored in advance in the processing 111 or in a memory connected thereto, not further indicated in FIG. 5.

A register 126 possibly contains examples of control data elements, which examples are consecutively compared to the row.

The processing unit 111, which composes supplementary and replacement data elements, respectively, and accommodates these in the row wherever necessary, is further coupled to an output buffer 119. The output buffer 119 may be provided with transmitting means not further shown.

It will be understood that a second processing device 105 may be constructed in a similar manner.

Which data elements are denoted as "control" is preferably determined in advance, e.g., at the time the communications system in question is initialised. It is also possible, however, to denote data elements per row as "control" and therefore as data elements to be excluded. For this purpose, prior to the row there will be transmitted an exclusion indication, which preferably denotes, in coded form, the data elements to be excluded.

It will therefore be understood by those skilled in the art that many modifications and amendments are possible without departing from the scope of the invention.

What is claimed is:

1. Method for transmitting a row of data elements, which row comprises normal data elements and control data elements, the method comprising:

detecting said control data elements within said row, and marking each control data element by supplementing a supplementary data element to the row to be transmitted, characterized in that:

the supplementary data element comprises a positional indication to the first control data element in the sequence of data elements of the row, each control data element is replaced by a replacement data element which comprises a positional indication to next control data element in the row, and a replacement data element does not correspond to a control data element.

2. Method according to claim 1 characterized in that said positional indication, within said replacement data element, to said next control data element comprises a relative position with respect to that replacement data element.

3. Method according to claim 1, characterized in that, if the positional indication of said next control data element is not capable of being accommodated within a supplementary or replacement data element, at least one further supplementary data element, which comprises one further positional indication, is inserted into the row.

4. Method according to claim 3, characterized in that the at least one further supplementary data element is inserted into the row at the farthest position whose positional indication is capable of being accommodated within a supplementary or replacement data element.

5. Method according to claim 1, characterized in that a supplementary or replacement data element comprises, apart from a positional indication, a length indication which indicates the number of data elements occupied by the positional indication.

6. Method according to claim 1, characterized in that a replacement data element additionally comprises a type indication of a replacement control data element.

7. Method according to claim 6, characterized in that the type indication is chosen such that correspondence with a control data element is excluded.

8. Method according to claim 1, characterized in that a data element is marked as a control data element if the data element corresponds to part of a control data element.

9. Method according to claim 8, characterized in that the length of the part plus the length of the data element equals the length of a control data element.

10. Method according to claim 1, characterized in that it is assumed in advance that a positional indication is part of a control data element.

11. Method according to claim 1, characterized in that, if the positional indication present in the supplementary data element has a smaller value than the length of the supplementary data element, the value is increased to said length by an auxiliary value, and that the replacement data element in question replaces the data element which begins at the position adjacent to the supplementary data element.

12. Method according to claim 1, characterized in that the length of the replacement data element is reduced by the auxiliary value.

13. Method according to claim 1, the row being transmitted into a data package having a head, characterized in that the supplementary data element is transmitted directly after the head.

14. Method according to claim 1, characterized in that a data element comprises exactly one byte.

15. A device, comprising means for carrying out the steps of the method according to claim 1, characterized by an input buffer for receiving data elements, comparison means for comparing data elements received having control data elements, a processing unit for replacing control data elements by replacement data elements, and transmitting means for transmitting processed data elements.

16. Device according to claim 15, characterized in that the comparison means comprise at least one counter for counting patterns.

17. Device according to claim 15, characterized in that the processing unit comprises a microprocessor.

18. A device for receiving data elements which have been transmitted by a device according to claim 15, characterized by an input buffer, detecting means for detecting positional indications, and processing means for, at positions indicated by the positional indications, replacing data elements by control data elements.

19. Device according to claim 18, characterized in that the detecting means are additionally arranged for detecting supplementary data elements.

20. A system for transmitting data elements, comprising a communications network, to which is connected a first device according to claim 15, for transmitting processed data elements, and to which is connected a second device according to claim 18 for receiving, via said communication network, data elements which have been transmitted by said first device.

* * * * *